United States Patent
Kinoshita et al.

(10) Patent No.: US 11,062,981 B2
(45) Date of Patent: Jul. 13, 2021

(54) BIDIRECTIONAL SWITCH AND BIDIRECTIONAL SWITCH DEVICE INCLUDING THE SWITCH

(71) Applicant: PANASONIC CORPORATION, Osaka (JP)

(72) Inventors: Yusuke Kinoshita, Kyoto (JP); Yasuhiro Yamada, Tokyo (JP); Takashi Ichiryu, Osaka (JP); Hidekazu Umeda, Osaka (JP)

(73) Assignee: Panasonic Corporation, Osaka (JP)

( * ) Notice: Subject to any disclaimer, the term of this patent is extended or adjusted under 35 U.S.C. 154(b) by 70 days.

(21) Appl. No.: 16/499,595

(22) PCT Filed: Mar. 26, 2018

(86) PCT No.: PCT/JP2018/012184
§ 371 (c)(1),
(2) Date: Sep. 30, 2019

(87) PCT Pub. No.: WO2018/181198
PCT Pub. Date: Oct. 4, 2018

(65) Prior Publication Data
US 2021/0104453 A1    Apr. 8, 2021

(30) Foreign Application Priority Data

Mar. 31, 2017   (JP) .............................. JP2017-072701

(51) Int. Cl.
*H01L 23/495*   (2006.01)
*H01L 23/31*    (2006.01)

(52) U.S. Cl.
CPC .... *H01L 23/49575* (2013.01); *H01L 23/3107* (2013.01); *H01L 23/4952* (2013.01);
(Continued)

(58) Field of Classification Search
CPC .......... H01L 23/49575; H01L 23/3107; H01L 23/49506; H01L 23/4952; H01L 23/49562; H01L 23/49568
See application file for complete search history.

(56) References Cited

U.S. PATENT DOCUMENTS

| 8,946,868 | B2 * | 2/2015 | Leung ............... H01L 23/49575 257/620 |
| 2009/0206363 | A1 | 8/2009 | MacHida et al. |

(Continued)

FOREIGN PATENT DOCUMENTS

| JP | 2009-200149 A | 9/2009 |
| JP | 2010-016093 A | 1/2010 |

(Continued)

OTHER PUBLICATIONS

Extended European Search Report issued in corresponding European Application No. 18775856.0, dated Mar. 12, 2020.

(Continued)

*Primary Examiner* — Marc Anthony Armand
(74) *Attorney, Agent, or Firm* — McDermott Will & Emery LLP

(57) ABSTRACT

A bidirectional switch includes: a first lateral transistor including a first semiconductor layer on the surface of a first conductive layer; a second lateral transistor including a second semiconductor layer on the surface of a second conductive layer; a connection member; a first conductor member; and a second conductor member. The connection member connects the first lateral transistor and the second lateral transistor together in anti-series. The first conductor member electrically connects the first source electrode of the first lateral transistor to the first conductive layer. The (Continued)

second conductor member electrically connects the second source electrode of the second lateral transistor to the second conductive layer.

20 Claims, 10 Drawing Sheets

(52) U.S. Cl.
CPC .. *H01L 23/49506* (2013.01); *H01L 23/49562* (2013.01); *H01L 23/49568* (2013.01)

(56) References Cited

U.S. PATENT DOCUMENTS

| | | | |
|---|---|---|---|
| 2010/0109015 A1 | 5/2010 | Ueno | |
| 2010/0117225 A1 | 5/2010 | Shiraishi et al. | |
| 2011/0147796 A1 | 6/2011 | Haeberlen et al. | |
| 2011/0297964 A1* | 12/2011 | Miura | H01L 24/48 257/77 |
| 2013/0009676 A1 | 1/2013 | Morita et al. | |
| 2015/0115313 A1 | 4/2015 | Otremba et al. | |
| 2015/0214141 A1* | 7/2015 | Ye | H01L 24/05 257/401 |
| 2015/0249020 A1 | 9/2015 | Haeberlen et al. | |
| 2016/0247751 A1 | 8/2016 | Kinzer | |

FOREIGN PATENT DOCUMENTS

| | | |
|---|---|---|
| JP | 2010-0109322 A | 5/2010 |
| JP | 2011-129924 A | 6/2011 |
| JP | 2011-204993 A | 10/2011 |
| JP | 2011-254387 A | 12/2011 |

OTHER PUBLICATIONS

International Search Report and Written Opinion issued in corresponding International Application No. PCT/JP2018/012184, dated May 22, 2018, with partial English translation.

* cited by examiner

US 11,062,981 B2

BIDIRECTIONAL SWITCH AND BIDIRECTIONAL SWITCH DEVICE INCLUDING THE SWITCH

CROSS-REFERENCE OF RELATED APPLICATIONS

This application is the U.S. National Phase under 35 U.S.C. § 371 of International Patent Application No. PCT/JP2018/012184, filed on Mar. 26, 2018, which in turn claims the benefit of Japanese Application No. 2017-072701, filed on Mar. 31, 2017, the entire disclosures of which Applications are incorporated by reference herein.

TECHNICAL FIELD

The present invention generally relates to a bidirectional switch and a bidirectional switch device including the bidirectional switch, and more particularly relates to a bidirectional switch including a plurality of lateral transistors and a bidirectional switch device including such a bidirectional switch.

BACKGROUND ART

An AC switch including a first compound semiconductor MOSFET and a second compound semiconductor MOSFET has been proposed in the art (see, for example, Patent Literature 1).

The AC switch disclosed in Patent Literature 1 further includes a first output terminal, a second output terminal, a gate terminal, and a source terminal. The respective gates of the first compound semiconductor MOSFET and the second compound semiconductor MOSFET are connected in common to the gate terminal. The respective sources of the first compound semiconductor MOSFET and the second compound semiconductor MOSFET are connected to the source terminal. The drain of the first compound semiconductor MOSFET is connected to the first output terminal. The drain of the second compound semiconductor MOSFET is connected to the second output terminal.

The first compound semiconductor MOSFET and the second compound semiconductor MOSFET are SiC devices that use SiC as a semiconductor material.

The first compound semiconductor MOSFET and the second compound semiconductor MOSFET are each implemented as an n-channel FET. When a predetermined OFF-state voltage (of 0 V, for example) is applied between the gate terminal and the source terminal, the first compound semiconductor MOSFET and the second compound semiconductor MOSFET are both OFF. On the other hand, when a predetermined ON-state voltage (of 18 V, for example) is applied between the gate terminal and the source terminal, the first compound semiconductor MOSFET and the second compound semiconductor MOSFET both turn ON, thus making the first output terminal and the second output terminal electrically conductive with each other and thereby forming a current path passing through the first compound semiconductor MOSFET and the second compound semiconductor MOSFET.

In the AC switch disclosed in Patent Literature 1, the first compound semiconductor MOSFET and the second compound semiconductor MOSFET are each implemented as a vertical transistor including two planar MOSFET elements. Patent Literature 1 describes that GaN may be used as a compound semiconductor material.

CITATION LIST

Patent Literature

Patent Literature 1: JP 2011-254387 A

SUMMARY OF INVENTION

Technical Problem

In a bidirectional switch using GaN, lateral transistors are more advantageous in terms of increasing the switching rate than vertical transistors. However, the present inventors discovered that a bidirectional switch including lateral transistors sometimes lost stability in its switching operation.

It is therefore an object of the present invention to provide a bidirectional switch with the ability to perform its switching operation with increased stability and also provide a bidirectional switch device including such a bidirectional switch.

Solution to Problem

A bidirectional switch according to an aspect of the present invention includes a first conductive layer, a second conductive layer, a first lateral transistor, a second lateral transistor, a connection member, a first conductor member, and a second conductor member. The first conductive layer has a surface and a back surface that are located opposite from each other along thickness of the first conductive layer. The second conductive layer has a surface and a back surface that are located opposite from each other along thickness of the second conductive layer. The first lateral transistor includes a first semiconductor layer, a first source electrode, a first gate electrode, and a first drain electrode. The first semiconductor layer is arranged on the surface of the first conductive layer. The first source electrode, the first gate electrode, and the first drain electrode are all arranged on one surface of the first semiconductor layer. The one surface of the first semiconductor layer is opposite from the other surface of the first semiconductor layer in contact with the first conductive layer. The second lateral transistor includes a second semiconductor layer, a second source electrode, a second gate electrode, and a second drain electrode. The second semiconductor layer is arranged on the surface of the second conductive layer. The second source electrode, the second gate electrode, and the second drain electrode are all arranged on one surface of the second semiconductor layer. The one surface of the second semiconductor layer is opposite from the other surface of the second semiconductor layer in contact with the second conductive layer. The connection member connects the first lateral transistor and the second lateral transistor together in anti-series. The first conductor member electrically connects the first source electrode of the first lateral transistor to the first conductive layer. The second conductor member electrically connects the second source electrode of the second lateral transistor to the second conductive layer.

In this bidirectional switch, the first conductive layer suitably includes: a first conductive die; and a first substrate with electrical conductivity, which is located between the first conductive die and the first semiconductor layer along thickness of the first conductive layer and which is bonded to the first conductive die. The first source electrode is suitably electrically connected to the first conductive die and also electrically connected to the first substrate via the first conductive die. The second conductive layer suitably includes: a second conductive die; and a second substrate with electrical conductivity, which is located between the second conductive die and the second semiconductor layer along thickness of the second conductive layer and which is bonded to the second conductive die. The second source electrode is suitably electrically connected to the second conductive die and also electrically connected to the second substrate via the second conductive die.

In this bidirectional switch, the connection member suitably connects the first lateral transistor and the second lateral transistor together in anti-series by electrically connecting the first drain electrode and the second drain electrode together.

In this bidirectional switch, the first lateral transistor and the second lateral transistor may be connected together in anti-series by electrically connecting the first source electrode and the second source electrode together.

In this bidirectional switch, the first conductor member and the second conductor member may be each implemented as a wire.

In this bidirectional switch, the first conductor member and the second conductor member may be each implemented as a conductor layer.

In this bidirectional switch, the connection member may include: a conductive substrate facing the back surface of the first conductive layer and the back surface of the second conductive layer; a wire connecting the first drain electrode to the conductive substrate; and another wire connecting the second drain electrode to the conductive substrate. The bidirectional switch may further include: a first electrical insulating layer provided between the first conductive layer and the conductive substrate; and a second electrical insulating layer provided between the second conductive layer and the conductive substrate.

In this bidirectional switch, the connection member may be implemented as a conductor layer.

A bidirectional switch device according to another aspect of the present invention includes: the bidirectional switch described above; a first gate terminal electrically connected to the first gate electrode; a second gate terminal electrically connected to the second gate electrode; and a package body housing the first gate terminal, the second gate terminal, and at least a part of the bidirectional switch.

In this bidirectional switch device, the first conductor member of the bidirectional switch may be partially located outside of the package body, and the second conductor member of the bidirectional switch may be partially located outside of the package body.

DESCRIPTION OF EMBODIMENTS

Note that first to fourth embodiments to be described below are only exemplary embodiments of the present invention and should not be construed as limiting. Rather, the first to fourth embodiments may be readily modified in various manners depending on a design choice or any other factor without departing from a true spirit and scope of the present invention. It should also be noted that FIG. 1, FIGS. 3A-8, and FIGS. 10A and 10B to be referred to in the following description of the first to fourth embodiments are just schematic representations, in which the dimensions and thicknesses of respective constituent elements and their ratios are not always to scale, compared with their actual dimensional ratios.

First Embodiment

A bidirectional switch 8a and a bidirectional switch device 9a according to a first exemplary embodiment will be described with reference to FIGS. 1-3B. The bidirectional switch 8a and bidirectional switch device 9a may be used in, for example, a matrix converter for performing AC-AC power conversion. However, this is only an example and should not be construed as limiting. Alternatively, the bidirectional switch 8a and bidirectional switch device 9a may also be used as an AC switch for relays and dimmers for lighting devices, for example.

Figure 1:
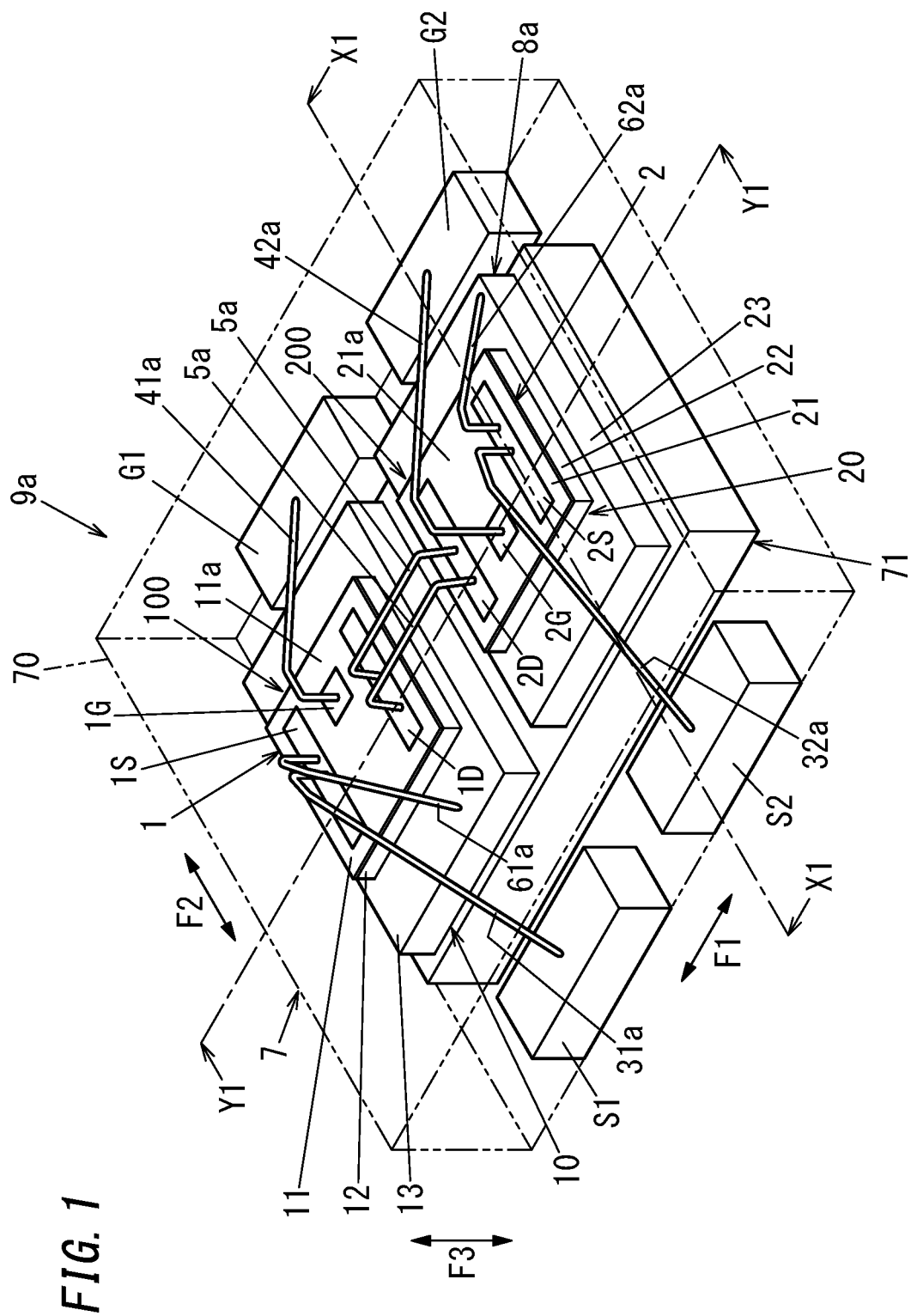
FIG. 1 is a perspective view of a bidirectional switch device including a bidirectional switch according to a first embodiment of the present invention.
Figure 2:
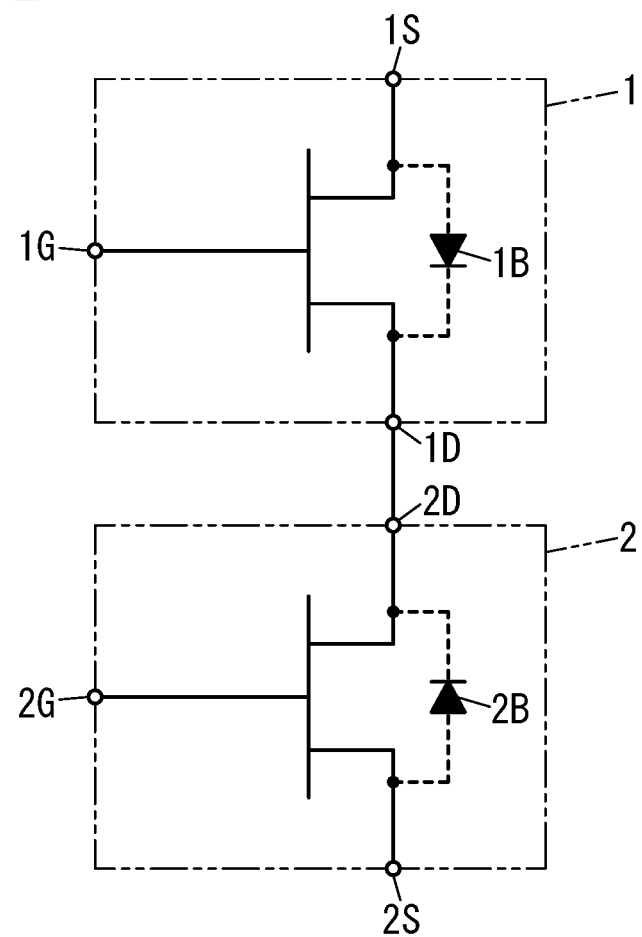
FIG. 2 is an equivalent circuit diagram of the bidirectional switch according to the first embodiment of the present invention.
Figure 3A:
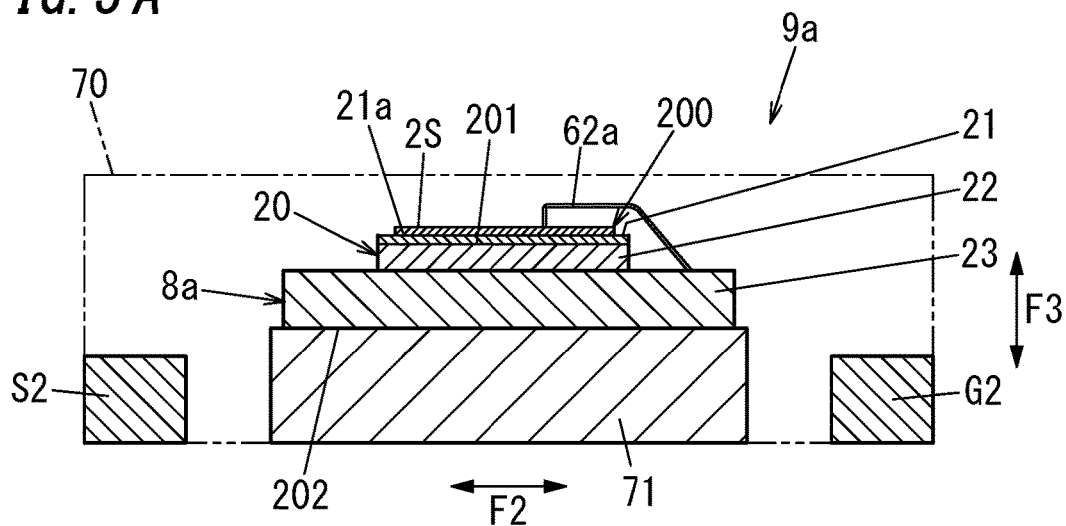
FIG. 3A is a cross-sectional view of the bidirectional switch device according to the first embodiment of the present invention taken along the plane indicated by the arrows XI-XI in FIG. 1.
Figure 3B:
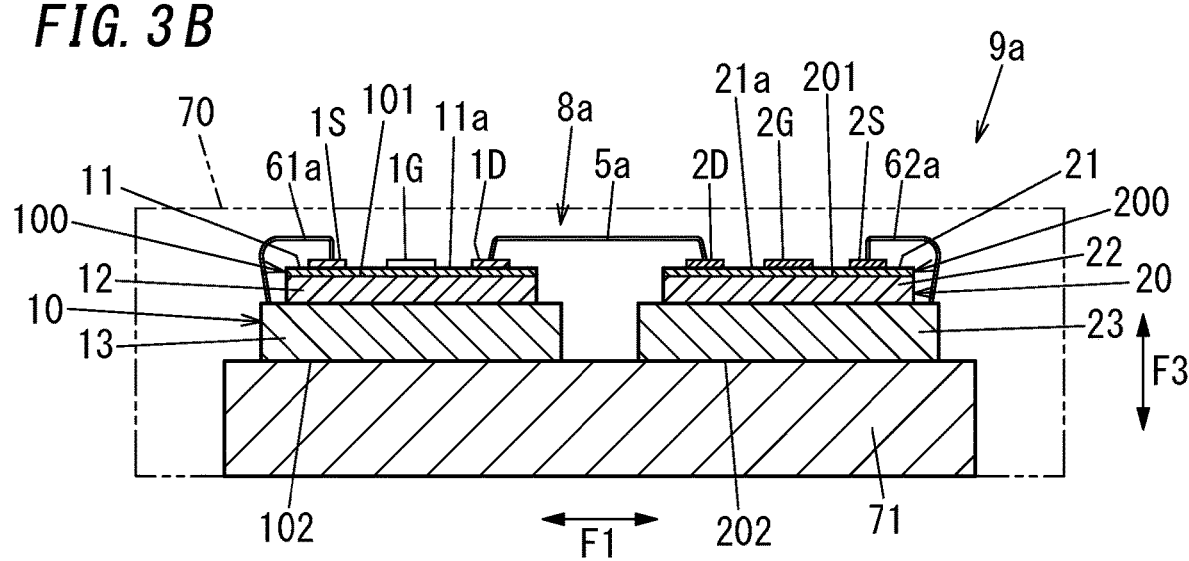
FIG. 3B is a cross-sectional view of the bidirectional switch device taken along the plane indicated by the arrows Y1-Y1 in FIG. 1.

As shown in FIG. 1, the bidirectional switch device 9a includes: a bidirectional switch 8a including a first lateral transistor chip 100 and a second lateral transistor chip 200; and a package 7 for protecting the bidirectional switch 8a.

The first lateral transistor chip 100 and second lateral transistor chip 200 are each implemented as a field-effect transistor (FET) chip. The first lateral transistor chip 100 (hereinafter simply referred to as a "first chip 100") includes a first substrate 12 and a first lateral transistor 1 formed on the first substrate 12. In this embodiment, the first lateral transistor 1 includes a first semiconductor layer 11 formed on the first substrate 12 and a first source electrode 1S, a first gate electrode 1G and a first drain electrode 1D, which are formed on the surface 11a of the first semiconductor layer 11. Likewise, the second lateral transistor chip 200 (hereinafter simply referred to as a "second chip 200") includes a second substrate 22 and a second lateral transistor 2 formed on the second substrate 22. In this embodiment, the second lateral transistor 2 includes a second semiconductor layer 21 formed on the second substrate 22 and a second source electrode 2S, a second gate electrode 2G, and a second drain electrode 2D, which are formed on the surface 21a of the second semiconductor layer 21.

In this bidirectional switch 8a, the first drain electrode 1D of the first lateral transistor 1 and the second drain electrode 2D of the second lateral transistor 2 are electrically connected together. That is to say, in this bidirectional switch 8a, the first lateral transistor 1 and the second lateral transistor 2 are connected together in anti-series. The first lateral transistor 1 and the second lateral transistor 2 are normally OFF (enhancement mode) FETs.

The package 7 includes a first gate terminal G1, a first source terminal S1, a second gate terminal G2, a second source terminal S2, an electrical insulating substrate 71, and a package body 70. In the bidirectional switch device 9a, the first gate electrode 1G and the first source electrode 1S of the first lateral transistor 1 are electrically connected to the first gate terminal G1 and the first source terminal S1, respectively. Also, in the bidirectional switch device 9a, the second gate electrode 2G and the second source electrode 2S of the second lateral transistor 2 are electrically connected to the second gate terminal G2 and the second source terminal S2, respectively. The bidirectional switch device 9a will be described later after the bidirectional switch 8a has been described in more detail.

In this bidirectional switch 8a, when the first lateral transistor 1 and the second lateral transistor 2 are both OFF, no current is allowed to flow in either direction between the first source electrode 1S and the second source electrode 2S. In this bidirectional switch 8a, when the first lateral transistor 1 and the second lateral transistor 2 are both ON, a current is allowed to flow bidirectionally between the first source electrode 1S and the second source electrode 2S.

In this bidirectional switch 8a, there is a parasitic diode 1B (see FIG. 2) between the first source electrode 1S and the first drain electrode 1D. Thus, when the first lateral transistor 1 is OFF but the second lateral transistor 2 is ON, a current is allowed to flow from the first source electrode 1S toward the second source electrode 2S.

In this bidirectional switch 8a, there is another parasitic diode 2B (see FIG. 2) between the second source electrode 2S and the second drain electrode 2D. Thus, when the second lateral transistor 2 is OFF but the first lateral transistor 1 is ON, a current is allowed to flow from the second source electrode 2S toward the first source electrode 1S.

As shown in FIG. 1, the bidirectional switch 8a includes a first conductor member 61a, a second conductor member 62a, and a connection member 5a.

The first lateral transistor 1 may be implemented as a GaN-based FET, more specifically, a type of normally OFF GaN-based high electron mobility transistor (HEMT). The first lateral transistor 1 is formed on the first substrate 12 as described above. In this embodiment, the first substrate 12 may be a silicon substrate. Thus, the first substrate 12 is a type of a conductive substrate. The first semiconductor layer 11 of the first lateral transistor 1 is formed on the first substrate 12 by a crystal-growing process such as a metalorganic vapor phase epitaxy (MOVPE) process, for example. The first semiconductor layer 11 includes a buffer layer, an undoped GaN layer, an undoped AlGaN layer, and a p-type AlGaN layer, which are arranged one on top of another in this order on the first substrate 12. The buffer layer may be an undoped AlN layer, for example. In the first semiconductor layer 11, the p-type AlGaN layer covers the surface of the undoped AlGaN layer only partially. Thus, the other surface 11a, opposite from the surface in contact with the first substrate 12, of the first semiconductor layer 11 includes regions, not covered with the p-type AlGaN layer, of the surface of the undoped AlGaN layer and the surface of the p-type AlGaN layer.

In the first lateral transistor 1, the first source electrode 1S, the first gate electrode 1G, and the first drain electrode 1D are provided on the surface 11a of the first semiconductor layer 11. The first source electrode 1S, the first gate electrode 1G, and the first drain electrode 1D are arranged in this order in one direction on the surface 11a of the first semiconductor layer 11. In the one direction, the first source electrode 1S, the first gate electrode 1G and the first drain electrode 1D are separate from each other. The first source electrode 1S and the first drain electrode 1D are formed in those regions, not covered with the p-type AlGaN layer, of the surface of the undoped AlGaN layer. The first gate electrode 1G is formed on the surface of the p-type AlGaN layer.

The second lateral transistor 2 may be implemented as a type of normally OFF GaN-based HEMT having the same configuration as the first lateral transistor 1. The second lateral transistor 2 is formed on the second substrate 22 as described above. In this embodiment, the second substrate 22 may be a silicon substrate. Thus, the second substrate 22 is a type of a conductive substrate. The second semiconductor layer 21, as well as the first semiconductor layer 11, includes a buffer layer, an undoped GaN layer, an undoped AlGaN layer, and a p-type AlGaN layer.

The bidirectional switch 8a includes connection members 5a electrically connecting the first drain electrode 1D and the second drain electrode 2D together. The connection members 5a connect the first chip 100 and the second chip 200 together in anti-series by electrically connecting the first drain electrode 1D and the second drain electrode 2D together. The connection members 5a may be implemented as wires (bonding wires). The bidirectional switch 8a includes two connection members 5a. However, this is only an example and should not be construed as limiting. Alternatively, the number of the connection members 5a provided may also be one, or even three or more, for example. The wires may be conductive wires such as Al fine wires.

The bidirectional switch 8a according to this embodiment includes a first conductive die 13 to mount the first chip 100 thereon and a second conductive die 23 to mount the second chip 200 thereon. Ina plan view, the first chip 100 and the second chip 200 may each have a square shape. However, this is only an example and should not be construed as limiting.

Alternatively, the first chip 100 and the second chip 200 may each have, for example, a rectangular shape in a plan view. The first conductive die 13 and the second conductive die 23 are each formed in a rectangular plate shape. In a plan view, the first conductive die 13 and the second conductive die 23 may each have a rectangular shape, for example. The first conductive die 13 and the second conductive die 23 have larger planar dimensions than the first chip 100 and the second chip 200, respectively. Each of the first conductive die 13 and the second conductive die 23 may be made of copper, a copper alloy, or any other suitable material. In this bidirectional switch 8a, bonding the first substrate 12 of the first chip 100 to the first conductive die 13 with a conductive material makes the first substrate 12 and the first conductive die 13 electrically connected together. Examples of the conductive material include conductive paste (such as silver paste). In the bidirectional switch 8a according to this embodiment, the first conductive die 13 and the first substrate 12 together form the first conductive layer 10.

The first conductive layer 10 has a surface 101 and a back surface 102 (see FIG. 3B), which are opposite from each other along thickness thereof. As used herein, the surface 101 of the first conductive layer 10 is one surface, arranged in contact with the first semiconductor layer 11, of the first substrate 12. That is to say, the first substrate 12 is arranged between the first conductive die 13 and the first semiconductor layer 11 along thickness of the first conductive layer 10. The back surface 102 of the first conductive layer 10 is the other surface, opposite from the surface in contact with the first substrate 12, of the first conductive die 13.

The second conductive layer 20 has a surface 201 and a back surface 202 (see FIGS. 3A and 3B), which are opposite from each other along thickness thereof. As used herein, the surface 201 of the second conductive layer 20 is one surface, arranged in contact with the second semiconductor layer 21, of the second substrate 22. That is to say, the second substrate 22 is arranged between the second conductive die 23 and the second semiconductor layer 21 along thickness of the second conductive layer 20. The back surface 202 of the second conductive layer 20 is the other surface, opposite from the surface in contact with the second substrate 22, of the second conductive die 23.

The bidirectional switch 8a includes a first conductor member 61a electrically connecting the first source electrode 1S of the first lateral transistor 1 to the first conductive die 13, and a second conductor member 62a electrically connecting the second source electrode 2S of the second lateral transistor 2 to the second conductive die 23. The first conductor member 61a and the second conductor member 62a are each implemented as a wire (i.e., a bonding wire). This bidirectional switch 8a including the first conductor member 61a electrically connects the first source electrode 1S of the first lateral transistor 1 to the first conductive layer 10 to make the potentials of the first source electrode 1S and the first conductive layer 10 equal to each other. In other words, the potential of the first conductive layer 10 is determined to be the potential of the first source electrode 1S of the first lateral transistor 1. More specifically, this bidirectional switch 8a is able to make the potential of the first substrate 12 of the first chip 100 and the potential of the first source electrode 1S equal to each other. In addition, the bidirectional switch 8a including the second conductor member 62b electrically connects the second source electrode 2S of the second lateral transistor 2 to the second conductive layer 20 to make the potentials of the second source electrode 2S and the second conductive layer 20 equal to each other. In other words, the potential of the second conductive layer 20 is determined to be the potential of the second source electrode 2S of the second lateral transistor 2. More specifically, this bidirectional switch 8a is able to make the potential of the second substrate 22 of the second chip 200 and the potential of the second source electrode 2S equal to each other.

The package 7 of the bidirectional switch device 9a is a surface mount package. The package 7 includes the first gate terminal G1, the first source terminal S1, the second gate terminal G2, the second source terminal S2, the electrical insulating substrate 71, and the package body 70, as described above. In the bidirectional switch device 9a, the first gate electrode 1G and first source electrode 1S of the first lateral transistor 1 are electrically connected to the first gate terminal G1 and the first source terminal S1, respectively. In the bidirectional switch device 9a, the second gate electrode 2G and second source electrode 2S of the second lateral transistor 2 are electrically connected to the second gate terminal G2 and the second source terminal S2, respectively.

The package body 70 of the package 7 is formed in a generally rectangular parallelepiped shape. The package body 70 has electrical insulation properties. In this embodiment, the package body 70 is made of a resin with electrical insulation properties. The package body 70 may be made of an encapsulating resin (such as an epoxy resin with black pigment) and have opacity. In the following description, the directions in which the first chip 100 and the second chip 200 are arranged side by side will be hereinafter referred to as "first directions F1" for the package body 70, and directions perpendicular to the first directions F1 and the thickness F3 of the package body 70 will be hereinafter referred to as "second directions F2."

In the package 7, the first source terminal S1 and the second source terminal S2 are arranged to be spaced apart, and electrically insulated, from each other in the first directions F1 with respect to the package body 70. In this embodiment, part of the package body 70 is interposed between the first source terminal S1 and the second source terminal S2. Likewise, the first gate terminal G1 and the second gate terminal G2 are also arranged to be spaced apart, and electrically insulated, from each other in the first directions F1 with respect to the package body 70. In this embodiment, part of the package body 70 is interposed between the first gate terminal G1 and the second gate terminal G2.

The bidirectional switch device 9a includes a single electrical insulating substrate 71 on which the first conductive die 13 and the second conductive die 23 are mounted. In this case, the first conductive die 13 and the second conductive die 23 are spaced apart from each other on the electrical insulating substrate 71. The electrical insulating substrate 71 is formed in a rectangular plate shape. In a plan view, the electrical insulating substrate 71 has a rectangular shape. When viewed along thickness of the electrical insulating substrate 71, the area of the electrical insulating substrate 71 is larger than the combined area of the first conductive die 13 and the second conductive die 23. To more efficiently dissipate the heat generated by the first chip 100 and the second chip 200, the electrical insulating substrate 71 suitably has higher thermal conductivity than the package body 70. The electrical insulating substrate 71 may be implemented as an AlN ceramic substrate, for example. In this package 7, the other surface, opposite from the surface with the first conductive die 13 and the second conductive die 23, of the electrical insulating substrate 71 is exposed on the back surface of the package body 70.

In this bidirectional switch device 9a, respective parts of the first gate terminal G1, second gate terminal G2, first source terminal S1, and second source terminal S2 are exposed through the back surface and side surfaces of the package body 70. In the package 7, the first gate terminal G1, the electrical insulating substrate 71, and the first source terminal S1 are arranged to be spaced apart from each other in the second directions F2 with respect to the package body 70. In addition, in the package 7, the second gate terminal G2, the electrical insulating substrate 71, and the second source terminal S2 are also arranged to be spaced apart from each other in the second directions F2 with respect to the package body 70.

To prevent the first conductive die 13 and the second conductive die 23 from discharging with the voltage applied between the first source terminal S1 and the second source terminal S2, some gap is suitably left between the respective facing surfaces of the first conductive die 13 and second conductive die 23.

The bidirectional switch device 9a includes a wire 31a connecting the first source electrode 1S and the first source terminal S1 together, and a wire 32a connecting the second source electrode 2S and the second source terminal S2 together. The bidirectional switch device 9a further includes a wire 41a connecting the first gate electrode 1G and the first gate terminal G1 together, and a wire 42a connecting the second gate electrode 2G and the second gate terminal G2 together. Each of these wires 31a, 32a, 41a, and 42a may be a bonding wire.

Optionally, the package 7 may further include, separately from the first gate terminal G1, the second gate terminal G2, the first source terminal S1, and the second source terminal S2, a first gate sense terminal, a second gate sense terminal, a first source sense terminal, and a second source sense terminal, which are connected to the first gate electrode 1G, the second gate electrode 2G, the first source electrode 1S, and the second source electrode 2S, respectively, and other terminals.

As described above, the first source electrode 1S of the first lateral transistor 1 and the first conductive layer 10 are electrically connected to each other via the first conductor member 61a, thus making the potential of the first conductive layer 10 equal to the potential of the first source electrode 1S. In addition, the second source electrode 2S of the second lateral transistor 2 and the second conductive layer 20 are electrically connected to each other via the second conductor member 62a, thus making the potential of the second conductive layer 20 equal to the potential of the second source electrode 2S. This stabilizes the potentials of the first substrate 12 and the second substrate 22. Therefore, this bidirectional switch 8a is allowed to perform its switching operation with more stability.

Suppose, in this bidirectional switch 8a, the drain-source voltage between the first drain electrode 1D and the first source electrode 1S is 100 V, for example. Also, suppose, in this bidirectional switch 8a, the gate-source voltage between the first gate electrode 1G and the first source electrode 1S is 5 V, for example. This bidirectional switch 8a is able to reduce, with more reliability, the number of electric lines of force directed from the first drain electrode 1D toward the first gate electrode 1G in the first semiconductor layer 11, compared to a situation where the first substrate 12 is not electrically connected to the first source electrode 1S (i.e., a situation where the first substrate 12 is not grounded but has a floating potential). This makes the capacitance between the first gate electrode 1G and the first drain electrode 1D of this bidirectional switch 8a smaller than the capacitance between the first gate electrode 1G and the first drain electrode 1D of a switch in which the first substrate 12 and the first source electrode 1S have mutually different potentials.

In the same way, this bidirectional switch 8a is also able to reduce, with more reliability, the number of electric lines of force directed from the second drain electrode 2D toward the second gate electrode 2G in the second semiconductor layer 21, compared to a situation where the second substrate 22 is not electrically connected to the second source electrode 2S. This makes the capacitance between the second gate electrode 2G and the second drain electrode 2D of this bidirectional switch 8a smaller than the capacitance between the second gate electrode 2G and the second drain electrode 2D of a switch in which the second substrate 22 and the second source electrode 2S have mutually different potentials. This allows the bidirectional switch 8a according to this embodiment to perform its switching operation more quickly.

As can be seen from the foregoing description of embodiments, a bidirectional switch 8a includes a first conductive layer 10, a second conductive layer 20, a first lateral transistor 1, a second lateral transistor 2, a connection member 5a, a first conductor member 61a, and a second conductor member 62a. The first conductive layer 10 has a surface 101 and a back surface 102 that are located opposite from each other along thickness of the first conductive layer 10. The second conductive layer 20 has a surface 201 and a back surface 202 that are located opposite from each other along thickness of the second conductive layer 20. The first lateral transistor 1 includes a first semiconductor layer 11, a first source electrode 1S, a first gate electrode 1G, and a first drain electrode 1D. The first semiconductor layer 11 is formed on the surface 101 of the first conductive layer 10. The first source electrode 1S, the first gate electrode 1G, and the first drain electrode 1D are all arranged on one surface of the first semiconductor layer 11. The one surface of the first semiconductor layer 11 is opposite from the other surface of the first semiconductor layer 11 in contact with the first conductive layer 10. The second lateral transistor 2 includes a second semiconductor layer 21, a second source electrode 2S, a second gate electrode 2G, and a second drain electrode 2D. The second semiconductor layer 21 is formed on the surface 201 of the second conductive layer 20. The second source electrode 2S, the second gate electrode 2G, and the second drain electrode 2D are all arranged on one surface of the second semiconductor layer 21. The one surface of the second semiconductor layer 21 is opposite from the other surface of the second semiconductor layer 21 in contact with the second conductive layer 20. The connection member 5a connects the first lateral transistor 1 and the second lateral transistor 2 together in anti-series. The first conductor member 61a electrically connect the first source electrode 1S of the first lateral transistor 1 to the first conductive layer 10. The second conductor member 62a electrically connects the second source electrode 2S of the second lateral transistor 2 to the second conductive layer 20. This allows the bidirectional switch 8a to perform its switching operation with increased stability.

In this bidirectional switch 8a, the first conductive layer 10 includes: a first conductive die 13; and a first substrate 12 with electrical conductivity, which is located between the first conductive die 13 and the first semiconductor layer 11 along thickness of the first conductive layer 10 and which is bonded to the first conductive die 13. The first source electrode 1S is electrically connected to the first conductive die 13 and also electrically connected to the first substrate 12 via the first conductive die 13. The second conductive layer 20 includes: a second conductive die 23; and a second substrate 22 with electrical conductivity, which is located between the second conductive die 23 and the second semiconductor layer 21 along thickness of the second conductive layer 20 and which is bonded to the second conductive die 23. The second source electrode 2S is electrically connected to the second conductive die 23 and also electrically connected to the second substrate 22 via the second conductive die 23. This makes the potential of the first substrate 12 generally equal to the potential of the first source electrode 1S and also makes the potential of the second substrate 22 generally equal to the potential of the second source electrode 2S, thus allowing the bidirectional switch 8a to turn ON even more quickly.

In this bidirectional switch 8a, the connection member 5a connects the first lateral transistor 1 and the second lateral transistor 2 together in anti-series by electrically connecting the first drain electrode 1D and the second drain electrode 2D together. This allows the bidirectional switch 8a to be used as a bidirectional switch with common drain connection.

In this bidirectional switch 8a, the first conductor member 61a and the second conductor member 62a are each implemented as a wire. This allows the first conductor member 61a and the second conductor member 62a to be formed easily in the bidirectional switch 8a.

A bidirectional switch 8a device 9a includes: the bidirectional switch 8a; a first gate terminal G1 electrically connected to the first gate electrode 1G; a second gate terminal G2 electrically connected to the second gate electrode 2G; and a package body 70. In the package body 70, the first gate terminal G1, the second gate terminal G2, and at least a part of the bidirectional switch 8a are housed. This allows the bidirectional switch device 9a to perform its switching operation with increased stability.

Figure 4:
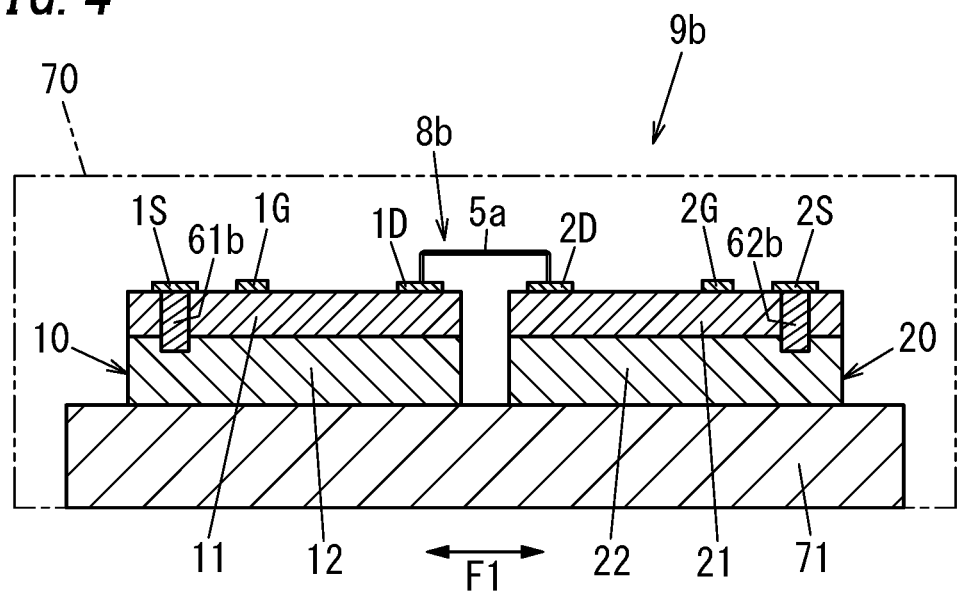
FIG. 4 is a cross-sectional view of a bidirectional switch device according to a variation of the first embodiment of the present invention.

Next, a bidirectional switch 8b according to a variation of this embodiment and a bidirectional switch device 9b including the bidirectional switch 8b will be described with reference to FIG. 4. In the following description, any constituent element of the bidirectional switch 8b and bidirectional switch device 9b according to this variation, having the same function as a counterpart of the bidirectional switch 8a and bidirectional switch device 9a according to the first embodiment described above, will be designated by the same reference numeral as that counterpart's.

In the bidirectional switch 8b according to this variation, the first conductor member 61b and the second conductor member 62b are different from the first conductor member 61a and second conductor member 62a of the bidirectional switch 8a according to the first embodiment.

In addition, the first conductive layer 10 of the bidirectional switch 8b according to this first variation does not include the first conductive die 13 but consists of only the first substrate 12. The first substrate 12 is arranged between the first semiconductor layer 11 and the electrical insulating substrate 71. Likewise, the second conductive layer 20 of the bidirectional switch 8a according to this first variation does not include the second conductive die 23, either, but consists of only the second substrate 22. The second substrate 22 is arranged between the second semiconductor layer 21 and the electrical insulating substrate 71.

In the bidirectional switch 8b according to this variation, the first conductor member 61b is implemented as a via (also called "via conductor") formed right under the first source electrode 1S to run through the first semiconductor layer 11. The first source electrode 1S is electrically connected to the first substrate 12 via the first conductor member 61b. The first conductor member 61b reaches halfway through the thickness of the first substrate 12. The via may be formed by etching and plating techniques, for example.

In the bidirectional switch 8b, the second conductor member 62b is implemented as a via (also called "via conductor") formed right under the second source electrode 2S to run through the second semiconductor layer 21. The second source electrode 2S is electrically connected to the second substrate 22 via the second conductor member 62b. The second conductor member 62b reaches halfway through the thickness of the second substrate 22. The via may be formed by etching and plating techniques, for example.

The bidirectional switch 8b and bidirectional switch device 9b according to this variation are able to reduce the number of parts required, the planar dimensions, and the thickness, compared to the bidirectional switch 8a and bidirectional switch device 9a according to the first embodiment.

Other variations will be enumerated one after another.

In the bidirectional switch 8a, the first lateral transistor 1 and the second lateral transistor 2 do not have to be arranged as described for the exemplary embodiment. For example, the first lateral transistor 1 and the second lateral transistor 2 may also be arranged such that the first gate electrode 1G and the second gate electrode 2G are arranged symmetrically to each other with respect to a line passing through the middle in the first directions F1 of the package body 70 and parallel to the second directions F2 for the package body 70. This allows the bidirectional switch device 9a to use wires 41a and 42a of substantially the same length. Thus, the wires 41a and 42a of the bidirectional switch device 9a come to have substantially equal resistance values and substantially equal parasitic inductance values. This reduces the chances of the first lateral transistor 1 and the second lateral transistor 2 operating differently in the bidirectional switch 8a and the bidirectional switch device 9a, thus further stabilizing their switching operation.

The first substrate 12 and the second substrate 22 may have a thickness of 150 μm, for example. However, this is only an example and should not be construed as limiting.

Also, the first conductive layer 10 and the second conductive layer 20 may each include an insulating substrate such as a sapphire substrate, instead of the first substrate 12 and second substrate 22 of silicon. In that case, the insulating substrates are suitably as thin as possible to curb a decline in switching rate, and their thickness is suitably equal to or less than the thickness of the first semiconductor layer 11 and the second semiconductor layer 21. In that case, even when a first substrate and a second substrate implemented as insulating substrates are used, the bidirectional switch 8a is still able to reduce the capacitance between the first drain electrode 1D and the first gate electrode 1G and the capacitance between the second drain electrode 2D and the second gate electrode 2G.

Furthermore, in the embodiment described above, the bidirectional switch device 9a includes a surface mount package as the package 7. However, this is only an example and should not be construed as limiting. Alternatively, the package of the bidirectional switch device 9a may also be a lead type package such as TO-22. In that case, the bidirectional switch device 9a may include the first source terminal S1, the second source terminal S2, the first gate terminal G1, and the second gate terminal G2 as respective lead terminals.

Furthermore, in the bidirectional switch device 9a, the first source terminal S1 and the second source terminal S2 are electrically insulated from each other. However, this is only an example and should not be construed as limiting. Alternatively, the first source terminal S1 and the second source terminal S2 may also be implemented as a single common source terminal.

Furthermore, in the bidirectional switch device 9a, the first gate terminal G1 and the second gate terminal G2 are electrically insulated from each other. However, this is only an example and should not be construed as limiting. Alternatively, the first gate terminal G1 and the second gate terminal G2 may also be implemented as a single common gate terminal.

Second Embodiment

Figure 5:
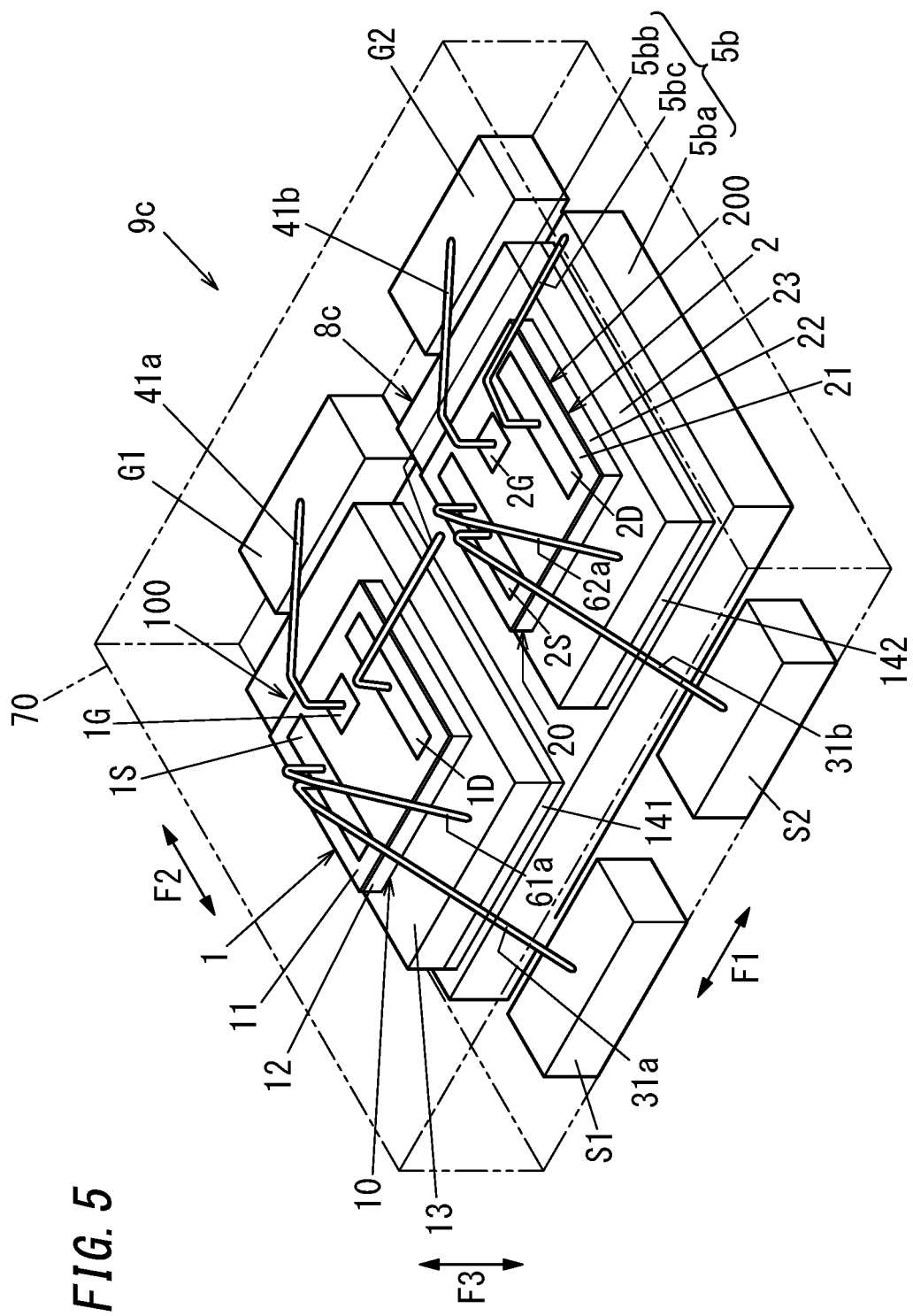
FIG. 5 is a perspective view of a bidirectional switch device including a bidirectional switch according to a second embodiment of the present invention.

Next, a bidirectional switch 8c and bidirectional switch device 9c according to a second embodiment will be described with reference to FIG. 5. In the bidirectional switch 8c and bidirectional switch device 9c according to this embodiment, connection members 5b have a different configuration from the connection members 5a of the first embodiment. In the following description, any constituent element of the bidirectional switch 8c and bidirectional switch device 9c according to the second embodiment, having the same function as a counterpart of the bidirectional switch 8a and bidirectional switch device 9a according to the first embodiment described above, will be designated by the same reference numeral as that counterpart's, and a detailed description thereof will be omitted herein.

The bidirectional switch 8c according to this embodiment includes a conductive substrate 5ba in place of the electrical insulating substrate 71 of the bidirectional switch device 9a according to the first embodiment. The bidirectional switch 8c according to this embodiment further includes a first electrical insulating layer 141 sandwiched between the first conductive die 13 and the conductive substrate 5ba and a second electrical insulating layer 142 sandwiched between the second conductive die 23 and the conductive substrate 5ba. The connection member 5b of the bidirectional switch 8c according to this embodiment includes the conductive substrate 5ba, a wire (conductive wire) 5bb connecting the first drain electrode 1D to the conductive substrate 5ba, and a wire (conductive wire) 5bc connecting the second drain electrode 2D to the conductive substrate 5ba. One terminal of the wire 5bb is electrically connected to the first drain electrode 1D. The first drain electrode 1D is electrically connected to the conductive substrate 5ba via the wire 5bb. The second drain electrode 2D is electrically connected to the conductive substrate 5ba via the wire 5bc. This allows the first drain electrode 1D and the second drain electrode 2D to be electrically connected together via the conductive substrate 5ba, the wire 5bb, and the wire 5bc.

In the bidirectional switch 8c according to this embodiment, the first drain electrode 1D and the second drain electrode 2D are electrically connected together via the connection member 5b including the conductive substrate 5ba, the wire 5bb, and the wire 5bc. This allows the bidirectional switch 8c according to this embodiment to prevent the connection member 5b from electrically and magnetically interfering with the wires 31a, 32a, 41a, and 42a. The bidirectional switch 8c also reduces the effect of noise between the first gate electrode 1G and the first source electrode 1S and between the second gate electrode 2G and the second source electrode 2S. The bidirectional switch 8c and bidirectional switch device 9c according to this embodiment achieve not only the advantage of performing their switching operation with increased stability but also the advantage of reducing the effect of noise between the first gate electrode 1G and the first source electrode 1S and between the second gate electrode 2G and the second source electrode 2S.

In the bidirectional switch 8c and bidirectional switch device 9c, the conductive substrate 5ba may be made of copper, a copper alloy, or any other suitable material. The conductive substrate 5ba is implemented as a conductive die. In the bidirectional switch 8c and bidirectional switch device 9c, the thickness of the first electrical insulating layer 141 and the second electrical insulating layer 142 is suitably set such that a potential difference, produced between the first source terminal S1 and the second source terminal S2, does not cause dielectric breakdown to the first electrical insulating layer 141 or the second electrical insulating layer 142. In the bidirectional switch 8c and bidirectional switch device 9c, the first electrical insulating layer 141 and the second electrical insulating layer 142 are suitably as thin as possible.

In the bidirectional switch 8c, the connection member 5b includes the single conductive substrate 5ba facing the back surface 102 of the first conductive layer 10 and the back surface 202 of the second conductive layer 20, the wire 5bb connecting the first drain electrode 1D and the conductive substrate 5ba, and the wire 5bc connecting the second drain electrode 2D and the conductive substrate 5ba. The bidirectional switch 8c further includes the first electrical insulating layer 141 sandwiched between the first conductive layer 10 and the conductive substrate 5ba and the second electrical insulating layer 142 sandwiched between the second conductive layer 20 and the conductive substrate 5ba. This allows the bidirectional switch 8c to be used as a bidirectional switch with common drain connection.

Third Embodiment

Figure 6:
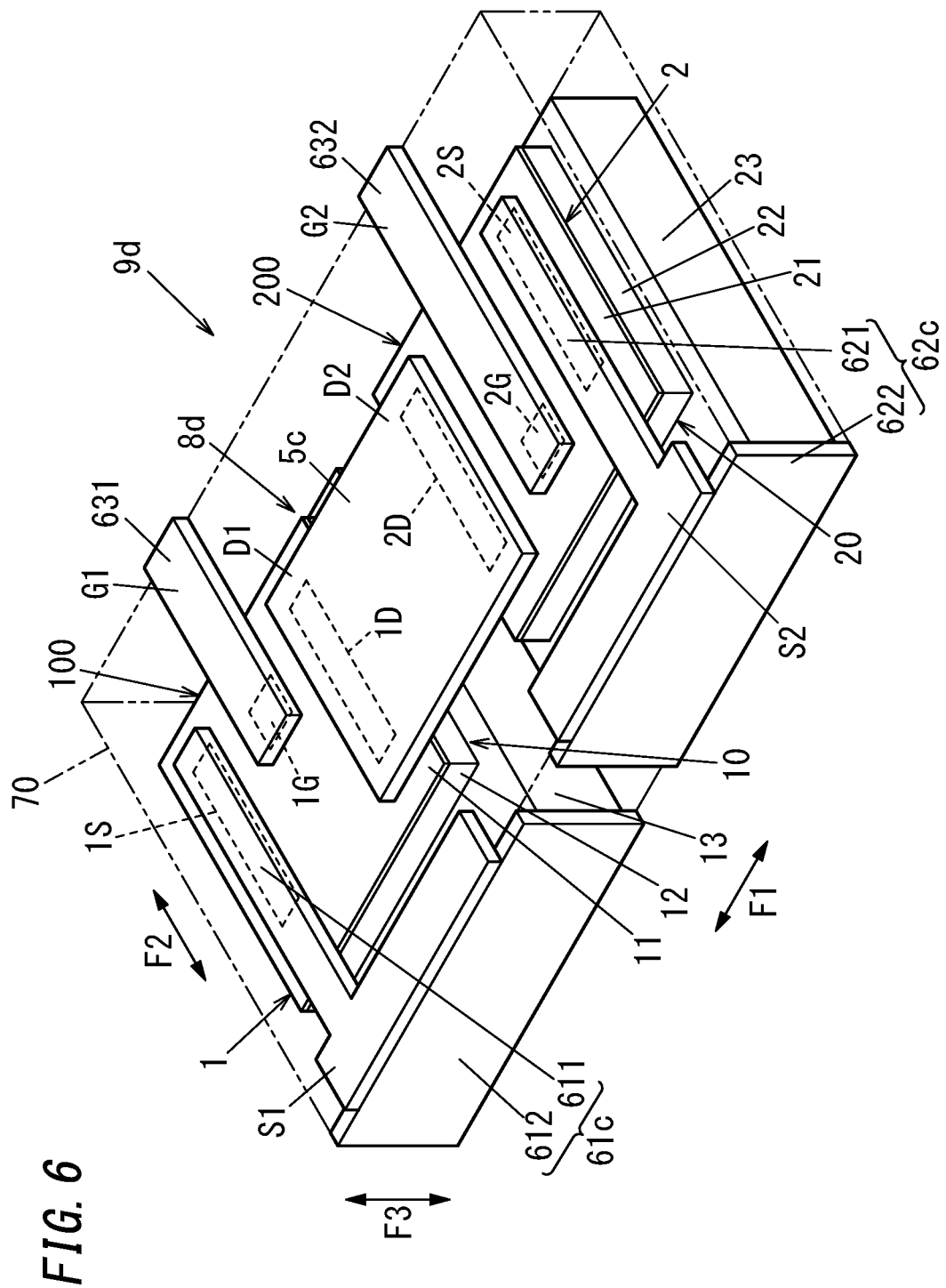
FIG. 6 is a perspective view of a bidirectional switch device including a bidirectional switch according to a third embodiment of the present invention.

Next, a bidirectional switch 8d and bidirectional switch device 9d according to a third embodiment will be described with reference to FIG. 6. In the bidirectional switch 8d and bidirectional switch device 9d according to this embodiment, a first conductor member 61c, a second conductor member 62c, and a connection member 5c thereof are different from the first conductor member 61a, second conductor member 62b, and connection member 5a according to the first embodiment. The bidirectional switch 8d according to this embodiment does not include the electrical insulating substrate 71, which is another major difference from the bidirectional switch 8a according to the first embodiment.

In the following description, any constituent element of the bidirectional switch 8d according to the third embodiment, having the same function as a counterpart of the bidirectional switch 8a according to the first embodiment described above, will be designated by the same reference numeral as that counterpart's, and a detailed description thereof will be omitted herein.

The connection member 5c is a conductor layer that electrically connects the first drain electrode 1D and the second drain electrode 2D together. This conductor layer is a plated layer made of a plated metal. The connection member 5c has one end in one of the first directions F1 for the package body 70 connected to the first drain electrode 1D and has the other end in the other of the first directions F1 for the package body 70 electrically connected to the second drain electrode 2D. The connection member 5c is arranged to cover the first drain electrode 1D and the second drain electrode 2D.

The first conductor member 61c is a conductor layer connecting the first source electrode 1S and the first conductive die 13 together. This conductor layer is a plated layer made of a plated metal. The first conductor member 61c includes a first part 611 electrically connected to the first source electrode 1S and a second part 612 electrically connected to the first conductive die 13. The first part 611 of the first conductor member 61c has an L-shape in a plan view. The first part 611 of the first conductor member 61c is arranged to cover the first source electrode 1S. The second part 612 of the first conductor member 61c is arranged to cover one side surface of the first conductive die 13. The first part 611 and the second part 612 are partially exposed at one end of the package body 70 in one of the second directions F2. The first part 611 and the second part 612 serve as the first source terminal S1.

The bidirectional switch 8d further includes a first connection layer 631 connected to the first gate electrode 1G. The first connection layer 631 is a conductor layer. This conductor layer is a plated layer made of a plated metal. The first connection layer 631 has a rectangular shape in a plan view. One longitudinal end of the first connection layer 631 is electrically connected to the first gate electrode 1G. The first connection layer 631 serves as the first gate terminal G1 as well. The other end of the first connection layer 631 is exposed at the other end of the package body 70 in the other of the second directions F2.

The second conductor member 62c is a conductor layer connecting the second source electrode 2S and the second conductive die 23 together. This conductor layer is a plated layer made of a plated metal. The second conductor member 62c includes a first part 621 electrically connected to the second source electrode 2S and a second part 622 electrically connected to the second conductive die 23. The first part 621 of the second conductor member 62c has an L-shape in a plan view. The first part 621 of the second conductor member 62c is arranged to cover the second source electrode 2S. The second part 622 of the second conductor member 62c is arranged to cover one side surface of the second conductive die 23. The first part 621 and the second part 622 are partially exposed at one end of the package body 70 in one of the second directions F2. The first part 621 and the second part 622 serve as the second source terminal S2.

The bidirectional switch 8d further includes a second connection layer 632 connected to the second gate electrode 2G. The second connection layer 632 is a conductor layer. This conductor layer is a plated layer made of a plated metal. The second connection layer 632 has a rectangular shape in a plan view. One longitudinal end of the second connection layer 632 is electrically connected to the second gate electrode 2G. The second connection layer 632 serves as the second gate terminal G2 as well. The other end of the second connection layer 632 is exposed at the other end of the package body 70 in the other of the second directions F2.

In the bidirectional switch 8d according to this embodiment, the connection member 5c is implemented as a conductor layer. The connection member 5c of the bidirectional switch 8d according to this embodiment has a larger cross-sectional area than the connection members (wires) 5a of the bidirectional switch 8a according to the first embodiment. Thus, the connection member 5c of the bidirectional switch 8d according to this embodiment has a smaller resistance value and a smaller inductance value than the connection members 5a of the bidirectional switch 8a according to the first embodiment. This allows the bidirectional switch 8d and bidirectional switch device 9d according to this embodiment to achieve not only the advantage of performing their switching operation with more stability but also cutting down energy loss more effectively, thus contributing to energy saving of a matrix converter, for example.

Also, the connection member 5c of the bidirectional switch 8d according to this embodiment has a larger surface area than the connection members (wires) 5a of the bidirectional switch 8a according to the first embodiment. This allows the bidirectional switch 8d according to this embodiment to dissipate heat more efficiently and perform its switching operation with more stability.

The bidirectional switch 8d according to this embodiment makes the connection member 5c connect the first drain electrode 1D and the second drain electrode 2D together, and therefore, serves as a common-drain bidirectional switch. In addition, the first conductive die 13 and the second conductive die 23 serve as pads to mount the first chip 100 and the second chip 200, respectively. Thus, the bidirectional switch 8d and bidirectional switch device 9d may have smaller dimensions and thickness than the bidirectional switch 8a and bidirectional switch device 9a according to the first embodiment.

In the bidirectional switch 8d, the first conductor member 61c and the second conductor member 62c are each implemented as a conductor layer. Thus, each of the first and second conductor members 61c and 62c of the bidirectional switch 8d according to this embodiment has a larger cross-sectional area than an associated one of the first and second conductor members 61a and 62a of the bidirectional switch 8a according to the first embodiment. This allows the bidirectional switch 8d and bidirectional switch device 9d to further cut down the energy loss.

In the bidirectional switch 8d, the connection member 5c is implemented as a conductor layer. Thus, the connection member 5c of the bidirectional switch 8d according to this embodiment has a larger cross-sectional area than the connection members 5a of the bidirectional switch 8a according to the first embodiment. This allows the bidirectional switch 8d and bidirectional switch device 9d to further cut down the energy loss.

In the bidirectional switch 8d, the first conductor member 61c may be partially located outside of the package body 70. In the bidirectional switch 8d, the second conductor member 62c may also be partially located outside of the package body 70.

Optionally, in the bidirectional switch 8d, the first conductor member 61c and the first conductive die 13 may be electrically connected together through a via conductor. The second conductor member 62c and the second conductive die 23 may also be electrically connected together through a via conductor.

Optionally, in the bidirectional switch 8d, the first conductive die 13 and the second conductive die 23 may be each implemented as a thin-film conductive layer.

Optionally, in the bidirectional switch 8d, the first substrate 12 and the first conductive die 13 may be electrically connected together through a via conductor. The second substrate 22 and the second conductive die 23 may also be electrically connected together through a via conductor.

Figure 7A:
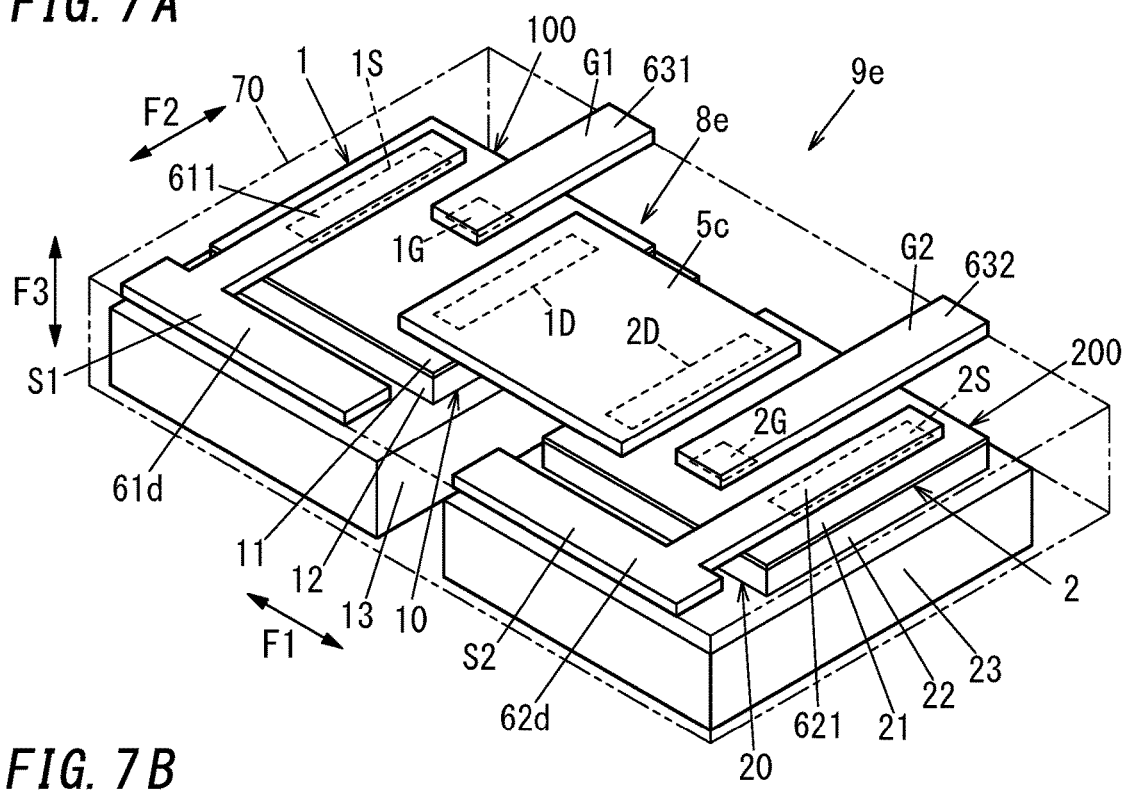
FIG. 7A is a perspective view of a bidirectional switch device including a bidirectional switch according to a variation of the third embodiment of the present invention.

A bidirectional switch 8e and bidirectional switch device 9e according to a variation of this embodiment will be described with reference to FIGS. 7A and 7B. In the bidirectional switch 8e and bidirectional switch device 9e according to this variation, the first conductor member 61d consists of only the first part 611 and the second conductor member 62d consists of only the first part 621 as shown in FIG. 7A.

Figure 7B:
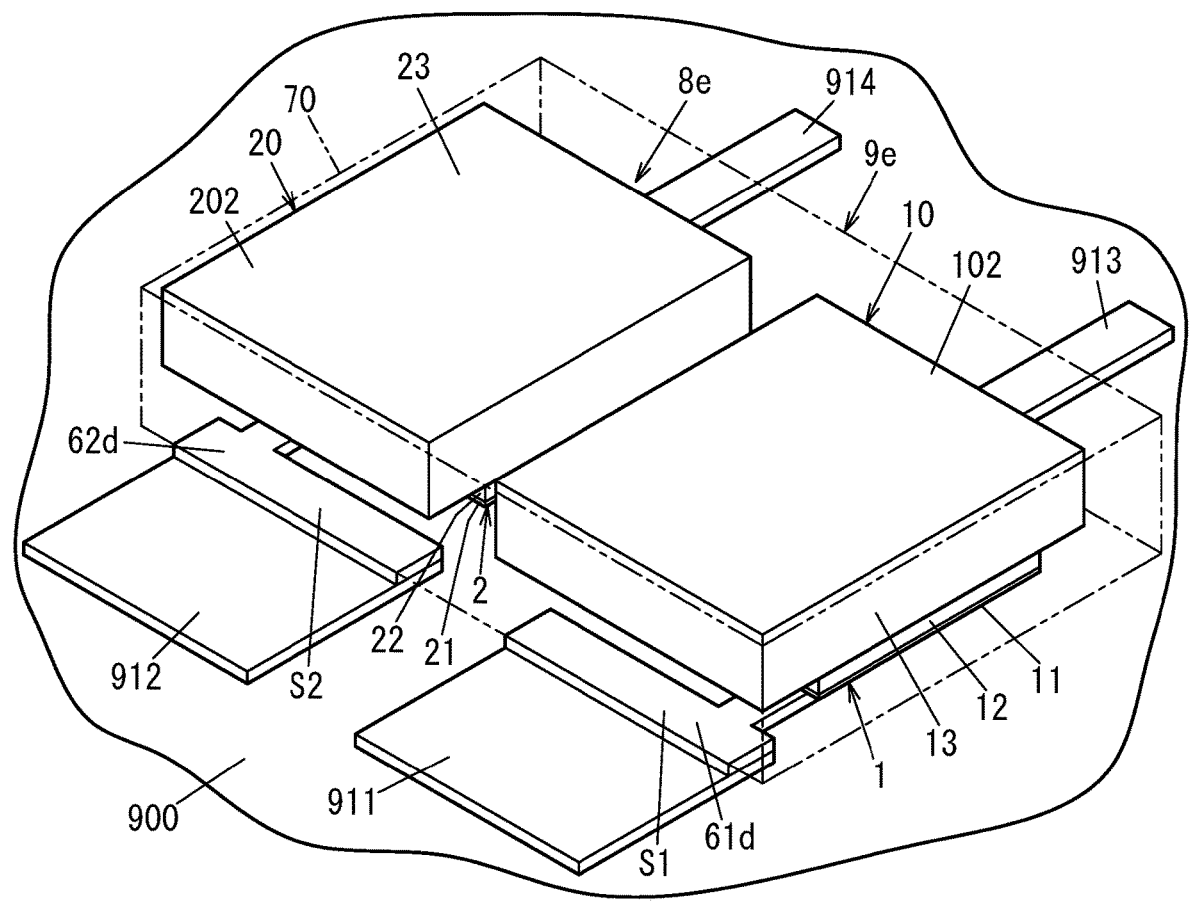
FIG. 7B is a perspective view illustrating a state of the bidirectional switch device mounted on a printed wiring board.

The other surface, opposite from the surface bonded to the first substrate 12, of the first conductive die 13 (i.e., the back surface 102 of the first conductive layer 10) is exposed out of the package body 70 as shown in FIG. 7B. Likewise, the other surface, opposite from the surface bonded to the second substrate 22, of the second conductive die 23 (i.e., the back surface 202 of the second conductive layer 20) is exposed out of the package body 70.

Furthermore, the first part 611 of the first conductor member 61d is partially exposed out of the package body 70. Likewise, the first part 621 of the second conductor member 62d is also partially exposed out of the package body 70.

In this variation, the bidirectional switch device 9e may be bonded facedown onto a printed wiring board 900, for example. The printed wiring board 900 includes a first source line 911 electrically connected to the first source electrode 1S and a second source line 912 electrically connected to the second source electrode 2S. The first part 611 of the first conductor member 61*d* may be connected with solder, for example, to the first source line 911. The first part 621 of the second conductor member 62*d* may be connected with solder, for example, to the second source line 912.

The first source line 911 may be electrically connected to the first conductive die 13 with a wire, a clip, or solder, for example. The second source line 912 may be electrically connected to the second conductive die 23 with a wire, a clip, or solder, for example.

The bidirectional switch 8*e* and bidirectional switch device 9*e* according to this variation are able to conduct the heat generated by the first lateral transistor 1 and the second lateral transistor 2 to the printed wiring board 900 via the first conductive die 13 and the second conductive die 23, respectively. This allows the bidirectional switch 8*e* and bidirectional switch device 9*e* to efficiently dissipate the heat generated by the bidirectional switch 8*e*.

Fourth Embodiment

Figure 8:
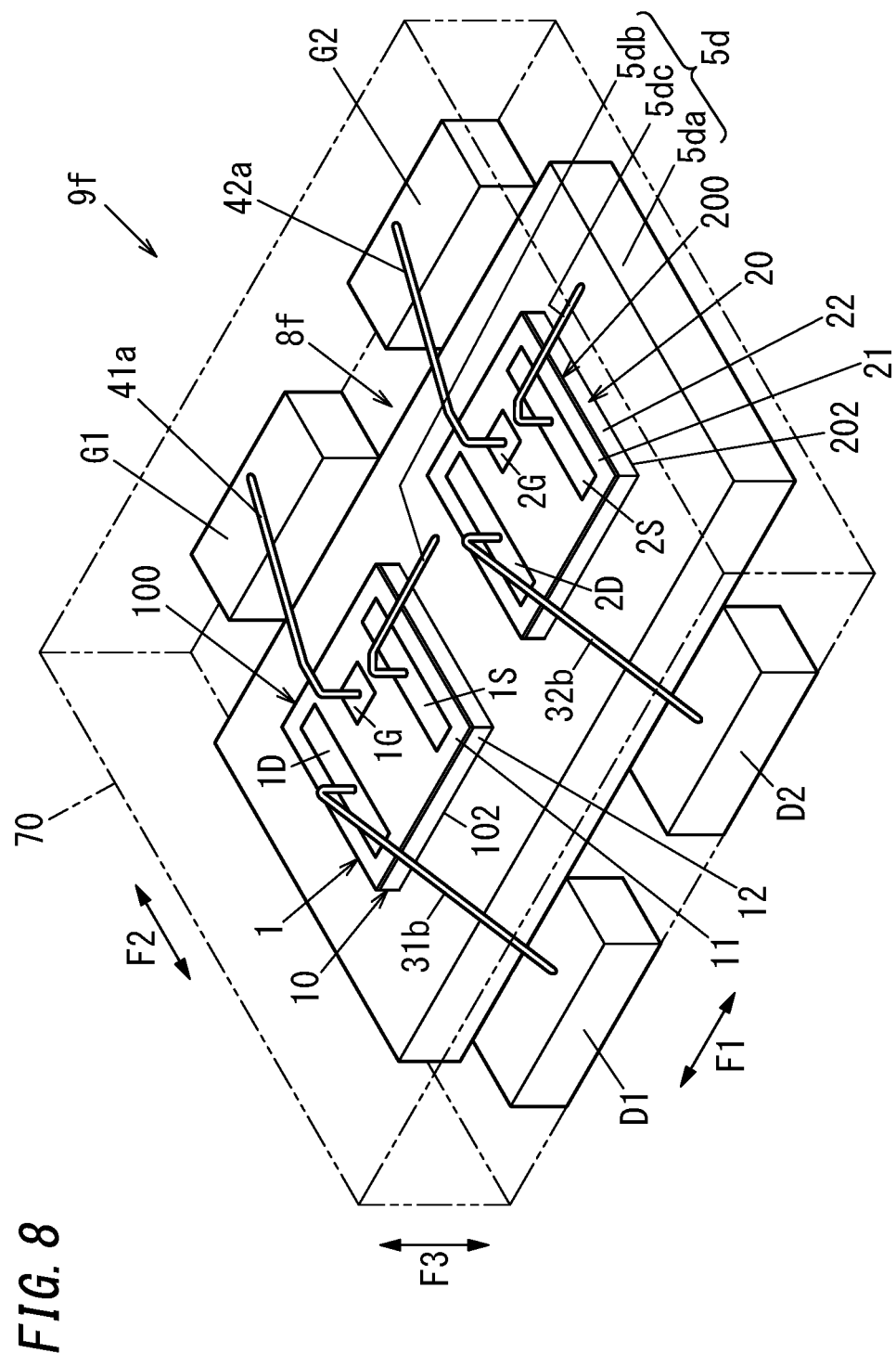
FIG. 8 is a perspective view of a bidirectional switch device including a bidirectional switch according to a fourth embodiment of the present invention.

A bidirectional switch 8*f* and bidirectional switch device 9*f* according to a fourth embodiment will be described with reference to FIGS. 8 and 9. In the following description, any constituent element of the bidirectional switch 8*f* and bidirectional switch device 9*f* according to this embodiment, having the same function as a counterpart of the bidirectional switch 8*a* and bidirectional switch device 9*a* according to the first embodiment described above, will be designated by the same reference numeral as that counterpart's, and a detailed description thereof will be omitted herein.

In the bidirectional switch 8*f* according to this embodiment, the first source electrode 1S of the first lateral transistor 1 and the second source electrode 2S of the second lateral transistor 2 are electrically connected together with a connection member 5*d*. That is to say, the bidirectional switch 8*f* according to this embodiment is a common-source bidirectional switch. The bidirectional switch 8*f* includes a first drain terminal D1 and a second drain terminal D2. The bidirectional switch 8*f* according to this embodiment includes neither the first conductive die 13 nor the second conductive die 23, which is a major difference from the bidirectional switch 8*a* according to the first embodiment.

The connection member 5*d* of the bidirectional switch 8*f* includes a conductive die 5*da* bonded to the back surface 102 of the first conductive layer 10 and the back surface 202 of the second conductive layer 20. The connection member 5*d* further includes a wire (conductive wire) 5*db* connecting the first source electrode 1S and the conductive die 5*da* together and a wire (conductive wire) 5*dc* connecting the second source electrode 2S and the conductive die 5*da* together.

The first drain electrode 1D of the first lateral transistor 1 is electrically connected to the first drain terminal D1 via a wire (conductive wire) 31*b*. The second drain electrode 2D is electrically connected to the second drain terminal D2 via a wire (conductive wire) 32*b*.

The first drain terminal D1 and the second drain terminal D2 are arranged to be spaced apart from each other in the first directions F1 with respect to the package body 70 and are electrically insulated from each other. In this embodiment, part of the package body 70 is interposed between the first drain terminal D1 and the second drain terminal D2. The first gate terminal G1 and the second gate terminal G2 are arranged to be spaced apart from each other in the first directions F1 with respect to the package body 70 and are electrically insulated from each other. In this embodiment, part of the package body 70 is interposed between the first gate terminal G1 and the second gate terminal G2.

In the bidirectional switch 8*f* and bidirectional switch device 9*f* according to this embodiment, the first source electrode 1S and the second source electrode 2S are electrically connected together via the conductive die 5*da*, the wire 5*db*, and the wire 5*dc*. Thus, the bidirectional switch 8*f* according to this embodiment requires a smaller number of parts than the bidirectional switch 8*a* according to the first embodiment. This allows the bidirectional switch 8*f* and bidirectional switch device 9*f* to achieve not only the advantage of performing their switching operation with more stability but also having a reduced thickness as well.

Figure 9:
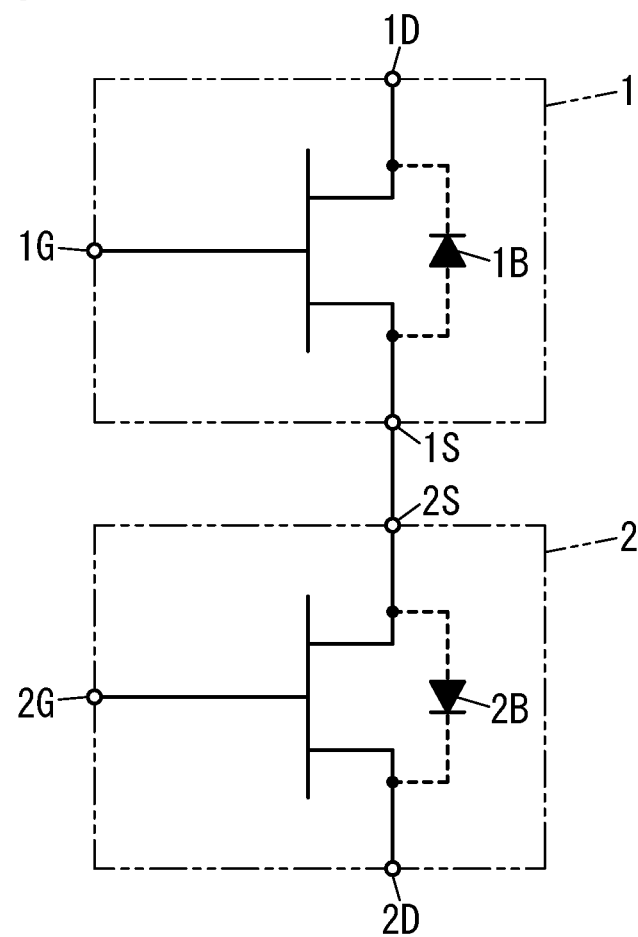
FIG. 9 is an equivalent circuit diagram of the bidirectional switch according to the fourth embodiment of the present invention.

In this bidirectional switch 8*f*, electrically connecting the first source electrode 1S and the second source electrode 2S together makes the first lateral transistor 1 and the second lateral transistor 2 connected together in anti-series (see FIG. 9). This allows the bidirectional switch 8*f* to serve as a common-source bidirectional switch.

Figure 10A:
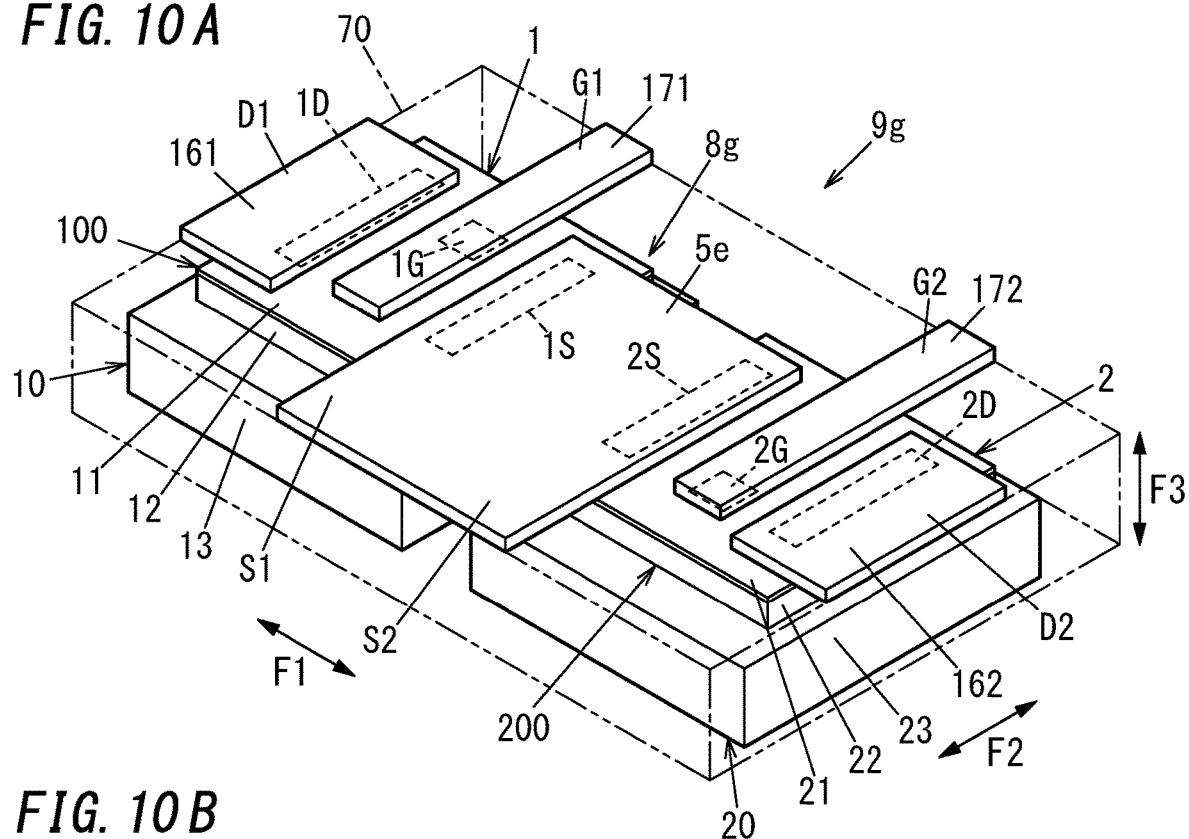
FIG. 10A is a perspective view of a bidirectional switch device including a bidirectional switch according to a variation of the fourth embodiment of the present invention.

Next, a bidirectional switch 8*g* and bidirectional switch device 9*g* according to a variation of this embodiment will be described with reference to FIGS. 10A and 10B.

A connection member 5*e* of the bidirectional switch 8*g* according to this variation may be implemented as a metal layer, for example. The connection member 5*e* electrically connects the first source electrode 1S and the second source electrode 2S together. The connection member 5*e* has one end thereof in one of the first directions F1 for the package body 70 electrically connected to the first source electrode 1S and has the other end thereof in the other of the first directions F1 for the package body 70 electrically connected to the second source electrode 2S. The connection member 5*e* is arranged to cover the first source electrode 1S and the second source electrode 2S. The connection member 5*e* is partially exposed out of the package body 70, and therefore, is able to serve as both the first source terminal S1 and the second source terminal S2.

The bidirectional switch 8*g* according to this variation includes a first drain connecting layer 161, a second drain connecting layer 162, a first gate connecting layer 171, and a second gate connecting layer 172.

The first drain connecting layer 161 is a conductor layer. This conductor layer is a plated layer made of a plated metal. The first drain connecting layer 161 has a rectangular shape in a plan view. The first drain connecting layer 161 is electrically connected to the first drain electrode 1D. The first drain connecting layer 161 is exposed out of the package body 70 to serve as the first drain terminal D1 as well.

The second drain connecting layer 162 is a conductor layer. This conductor layer is a plated layer made of a plated metal. The second drain connecting layer 162 has a rectangular shape in a plan view. The second drain connecting layer 162 is electrically connected to the second drain electrode 2D. The second drain connecting layer 162 is exposed out of the package body 70 to serve as the second drain terminal D2 as well.

The first gate connecting layer 171 is a conductor layer. This conductor layer is a plated layer made of a plated metal. The first gate connecting layer 171 has a rectangular shape in a plan view. The first gate connecting layer 171 is electrically connected to the first gate electrode 1G. The first gate connecting layer 171 is exposed out of the package body 70 to serve as the first gate terminal G1 as well.

The second gate connecting layer 172 is a conductor layer. This conductor layer is a plated layer made of a plated metal. The second gate connecting layer 172 has a rectangular shape in a plan view. The second gate connecting layer 172 is electrically connected to the second gate electrode 2G. The second gate connecting layer 172 is exposed out of the package body 70 to serve as the second gate terminal G2 as well.

Figure 10B:
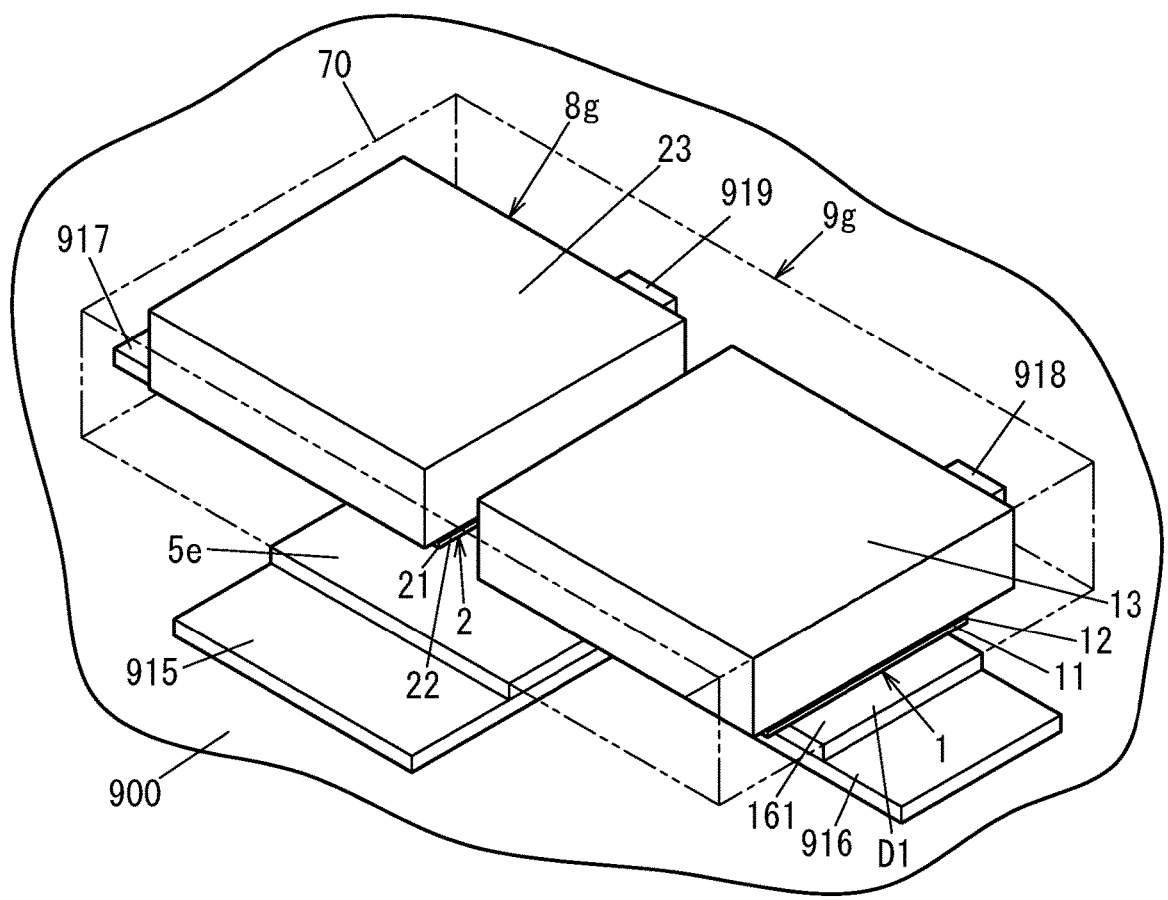
FIG. 10B is a perspective view illustrating a state of the bidirectional switch device mounted on a printed wiring board.

The other surface, opposite from the surface bonded to the first substrate 12, of the first conductive die 13 is exposed out of the package body 70 as shown in FIG. 10B. Likewise, the other surface, opposite from the surface bonded to the second substrate 22, of the second conductive die 23 is also exposed out of the package body 70.

In this variation, the printed wiring board 900 on which the bidirectional switch device 9g is mounted is provided with a common source line 915 electrically connected to the first source electrode 1S and the second source electrode 2S, a first gate line 918 electrically connected to the first gate electrode 1G, and a second gate line 919 electrically connected to the second gate electrode 2G. The printed wiring board 900 is further provided with a first drain line 916 electrically connected to the first drain electrode 1D and a second drain line 917 electrically connected to the second drain electrode 2D. The common source line 915 and the connection member 5e may be electrically connected together with solder, for example. The first drain connecting layer 161 may be electrically connected to the first drain line 916 with solder, for example. The second drain connecting layer 162 may be electrically connected to the second drain line 917 with solder, for example.

The common source line 915 may be electrically connected to the first conductive die 13 and the second conductive die 23 with a wire, a clip, or solder, for example.

In the bidirectional switch 8g and bidirectional switch device 9g according to this variation, the connection member 5e has a rectangular shape in a plan view. Thus, the connection member 5e of the bidirectional switch 8g according to this variation has a smaller resistance value and a smaller inductance value than the connection members 5a of the bidirectional switch 8a according to the first embodiment. This allows the bidirectional switch 8g and bidirectional switch device 9g according to this variation to achieve not only the advantage of stabilizing the switching operation of the first lateral transistor 1 and the second lateral transistor 2 but also cutting down energy loss more effectively as well.

In the bidirectional switch device 9g according to this embodiment, electrically connecting the common source line 915 and the first conductive die 13 with a wire (conductive wire), for example, may make the potential of the first source electrode 1S equal to the potential of the first conductive layer 10. In addition, in the bidirectional switch device 9g, electrically connecting the common source line 915 and the second conductive die 23 with a wire (conductive wire), for example, may make the potential of the second source electrode 2S equal to the potential of the second conductive layer 20.

REFERENCE SIGNS LIST

1 First Lateral Transistor
10 First Conductive Layer
101 Surface
102 Back Surface
11 First Semiconductor Layer
11a Surface
12 First Substrate
13 First Conductive Die
1D First Drain Electrode
1G First Gate Electrode
1S First Source Electrode
2 Second Lateral Transistor
20 Second Conductive Layer
201 Surface
202 Back Surface
21 Second Semiconductor Layer
21a Surface
22 Second Substrate
23 Second Conductive Die
2S Second Source Electrode
2D Second Drain Electrode
2G Second Gate Electrode
2S Second Source Electrode
5a, 5b, 5c Connection Member
5ba Conductive Substrate
5bb Wire
5bc Wire
61a, 61c First Conductor Member
62a, 62c Second Conductor Member
5da Conductive Die
8a, 8b, 8c, 8d, 8f, 8g Bidirectional Switch
70 Package Body
9a, 9b, 9c, 9d, 9f, 9g Bidirectional Switch Device
D1 First Drain Terminal
D2 Second Drain Terminal
G1 First Gate Terminal
G2 Second Gate Terminal
S1 First Source Terminal
S2 Second Source Terminal

The invention claimed is:

1. A bidirectional switch comprising:
a first conductive layer having a surface and a back surface that are located opposite from each other along thickness of the first conductive layer;
a second conductive layer having a surface and a back surface that are located opposite from each other along thickness of the second conductive layer;
a first lateral transistor including a first semiconductor layer, a first source electrode, a first gate electrode, and a first drain electrode, the first semiconductor layer being arranged on the surface of the first conductive layer, the first source electrode, the first gate electrode, and the first drain electrode being all arranged on one surface of the first semiconductor layer, the one surface of the first semiconductor layer being opposite from the other surface of the first semiconductor layer in contact with the first conductive layer;
a second lateral transistor including a second semiconductor layer, a second source electrode, a second gate electrode, and a second drain electrode, the second semiconductor layer being arranged on the surface of the second conductive layer, the second source electrode, the second gate electrode, and the second drain electrode being all arranged on one surface of the second semiconductor layer, the one surface of the second semiconductor layer being opposite from the other surface of the second semiconductor layer in contact with the second conductive layer;
a connection member connecting the first lateral transistor and the second lateral transistor together in anti-series;
a first conductor member directly connecting the first source electrode of the first lateral transistor to the first conductive layer; and a second conductor member directly connecting the second source electrode of the second lateral transistor to the second conductive layer.

2. The bidirectional switch of claim 1, wherein
the first conductive layer includes: a first conductive die; and a first substrate with electrical conductivity, the first substrate being located between the first conductive die and the first semiconductor layer along thickness of the first conductive layer, the first substrate being bonded to the first conductive die,
the first source electrode being electrically connected to the first conductive die and also electrically connected to the first substrate via the first conductive die,
the second conductive layer includes: a second conductive die; and a second substrate with electrical conductivity, the second substrate being located between the second conductive die and the second semiconductor layer along thickness of the second conductive layer, the second substrate being bonded to the second conductive die,
the second source electrode being electrically connected to the second conductive die and also electrically connected to the second substrate via the second conductive die.

3. The bidirectional switch of claim 1, wherein
the connection member connects the first lateral transistor and the second lateral transistor together in anti-series by electrically connecting the first drain electrode and the second drain electrode together.

4. The bidirectional switch of claim 1, wherein
the connection member connects the first lateral transistor and the second lateral transistor together in anti-series by electrically connecting the first source electrode and the second source electrode together.

5. The bidirectional switch of claim 1, wherein
the first conductor member and the second conductor member are each implemented as a wire.

6. The bidirectional switch of claim 1, wherein
the first conductor member and the second conductor member are each implemented as a conductor layer.

7. The bidirectional switch of claim 3, wherein
the connection member includes: a conductive substrate facing the back surface of the first conductive layer and the back surface of the second conductive layer; a wire connecting the first drain electrode to the conductive substrate; and another wire connecting the second drain electrode to the conductive substrate, and
the bidirectional switch further includes: a first electrical insulating layer provided between the first conductive layer and the conductive substrate; and a second electrical insulating layer provided between the second conductive layer and the conductive substrate.

8. The bidirectional switch of claim 1, wherein
the connection member is implemented as a conductor layer.

9. A bidirectional switch device comprising:
the bidirectional switch of claim 1;
a first gate terminal electrically connected to the first gate electrode;
a second gate terminal electrically connected to the second gate electrode; and
a package body housing the first gate terminal, the second gate terminal, and at least a part of the bidirectional switch.

10. The bidirectional switch device of claim 9, wherein
the first conductor member of the bidirectional switch is partially located outside of the package body, and
the second conductor member of the bidirectional switch is partially located outside of the package body.

11. The bidirectional switch of claim 2, wherein
the connection member connects the first lateral transistor and the second lateral transistor together in anti-series by electrically connecting the first drain electrode and the second drain electrode together.

12. The bidirectional switch of claim 2, wherein
the connection member connects the first lateral transistor and the second lateral transistor together in anti-series by electrically connecting the first source electrode and the second source electrode together.

13. The bidirectional switch of claim 2, wherein
the first conductor member and the second conductor member are each implemented as a wire.

14. The bidirectional switch of claim 3, wherein
the first conductor member and the second conductor member are each implemented as a wire.

15. The bidirectional switch of claim 4, wherein
the first conductor member and the second conductor member are each implemented as a wire.

16. The bidirectional switch of claim 2, wherein
the first conductor member and the second conductor member are each implemented as a conductor layer.

17. The bidirectional switch of claim 3, wherein
the first conductor member and the second conductor member are each implemented as a conductor layer.

18. The bidirectional switch of claim 4, wherein
the first conductor member and the second conductor member are each implemented as a conductor layer.

19. The bidirectional switch of claim 2, wherein
the connection member is implemented as a conductor layer.

20. The bidirectional switch of claim 3, wherein
the connection member is implemented as a conductor layer.

* * * * *